(12) United States Patent
Giuroiu

(10) Patent No.: US 8,482,339 B1
(45) Date of Patent: Jul. 9, 2013

(54) METHOD AND APPARATUS FOR TEMPERATURE COMPENSATION OF FILTER CIRCUITS

(75) Inventor: Horia Giuroiu, Campbell, CA (US)

(73) Assignee: National Acquisition Sub, Inc., Santa Clara, CA (US)

( * ) Notice: Subject to any disclaimer, the term of this patent is extended or adjusted under 35 U.S.C. 154(b) by 172 days.

(21) Appl. No.: 12/815,362

(22) Filed: Jun. 14, 2010

Related U.S. Application Data

(60) Provisional application No. 61/186,785, filed on Jun. 12, 2009.

(51) Int. Cl.
*H03K 3/42* (2006.01)
*H03K 17/78* (2006.01)

(52) U.S. Cl.
USPC .......................... 327/513; 327/552; 327/553

(58) Field of Classification Search
USPC ................. 327/512–513, 530–532, 551–559
See application file for complete search history.

(56) References Cited

U.S. PATENT DOCUMENTS

| 4,766,763 A * | 8/1988 | Kurtz ............................. 73/49.2 |
| 5,563,546 A * | 10/1996 | Tsukada ....................... 327/408 |
| 7,358,800 B2 * | 4/2008 | Lou et al. ...................... 327/553 |

* cited by examiner

*Primary Examiner* — Lincoln Donovan
*Assistant Examiner* — Diana J Cheng
(74) *Attorney, Agent, or Firm* — Andrew S. Viger; Wade J. Brady, III; Frederick J. Telecky, Jr.

(57) ABSTRACT

A voltage integrator circuit and a filter circuit are configurable to adjust their outputs in order to compensate for various circuit elements' variations with temperature. The voltage integrator circuit performs temperature compensation through the adjustment in resistance value of a single resistive element in response to a received control signal. The control signal correlates with a detected temperature value and causes the resistive element to adjust its resistance value in a manner that maintains the transfer function of the voltage integrator circuit under varying temperatures. The filter circuit comprises one or more of the voltage integrator circuits and maintains its transfer function under varying temperatures.

15 Claims, 12 Drawing Sheets

METHOD AND APPARATUS FOR TEMPERATURE COMPENSATION OF FILTER CIRCUITS

CROSS-REFERENCE TO RELATED APPLICATION

This application claims the benefit under 35 USC 119(e) of the commonly owned U.S. Provisional Application No. 61/186,785 entitled "METHOD AND APPARATUS FOR AN INVERTING GAIN STAGE OR INVERTING INTEGRATOR" filed on Jun. 12, 2009, which is incorporated by reference herein.

FIELD OF THE INVENTION

The present embodiments relate generally to filter circuits and voltage integrator circuits and more particularly to performing temperature compensation within filter circuits and voltage integrator circuits.

BACKGROUND

Transfer functions of inverting integrators depend on the values of various resistors and capacitors in the circuit. Because the resistance values of resistors and the capacitive values of capacitors vary independently with temperature, the transfer functions of integrators circuits often vary undesirably with temperature.

FIG. 1A shows an amplifier circuit 100 including an operational amplifier (op-amp) 101, three input resistors 111-113, and a feedback capacitor 121. As configured in FIG. 1A, the filter circuit 100 functions as an inverting voltage integrator circuit. The input resistors 111, 112, and 113 have resistance values of $R_A$, $R_B$, and $R_C$, respectively, and the capacitor 121 has a capacitance value of $C_A$. The inverting input of op-amp 101 is coupled to receive three input voltages $V_1$, $V_2$, and $V_3$ via respective resistors 111, 112, and 113. The non-inverting input of op-amp 101 is coupled to ground potential. The output of op-amp 101, which generates an output voltage V_out, is coupled to the inverting input of op-amp 101 by capacitor 121.

The output voltage of circuit 100 is expressed as:

$$V\_out(t) = -\frac{1}{C_A}\int_0^t \left(\frac{V_1(t)}{R_A} + \frac{V_2(t)}{R_B} + \frac{V_3(t)}{R_C}\right)dt + V\_out(0) \quad (1)$$

Because V_out is a function of $1/(R_A*C_A)$, $1/(R_B*C_A)$, and $1/(R_C*C_A)$, it is desirable to keep the values of $1/(R_A*C_A)$, $1/(R_B*C_A)$, and $1/(R_C*C_A)$ relatively constant across the range of operating temperatures. However, because capacitors and resistors are typically made of different materials and operate on different principles, capacitance and resistance values vary independently with temperature, and resistor values typically vary much more with temperature than capacitance values. As a result, the overall transfer function of circuit 100 varies with the temperature, which undesirably leads to performance degradation and even system instability under different operating conditions.

The variation of the transfer function with temperature is even more pronounced in certain applications of circuit 100. For example, in audio applications, the resistance values of the input resistors are on the order of mega-Ohms, and thus a high resistivity polysilicon material is typically used instead of normal polysilicon material. This high resistivity polysilicon material has a much larger temperature coefficient than normal polysilicon material, and therefore resistors made of such material vary much more with temperature than resistors made of normal polysilicon material. For example, the resistance values of resistors made of high resistivity polysilicon can vary as much as ±30% within operational temperature limits.

There is a need to control the variation of the transfer function of filter circuits such as integrators across operating temperatures. Although possible to adjust for the temperature variation of the transfer function by adjusting the input resistors 111-113, adjustments must be made to all the input resistors 111-113 at the same time because the ratio between the input resistor values must remain the same in order to maintain the same transfer function. Having multiple variable resistors within the same filter circuit is undesirable because variable resistors are complex and consume large amounts of die area.

It is also possible to compensate for the temperature variation of the transfer function by adjusting the capacitance value of the feedback capacitor 121. However, it is difficult to tune a capacitor to compensate for variations of resistance values. For example, complex calculations must be performed to translate variations in resistance values to a corresponding adjustment in capacitance value that compensates for the variations in the resistance values. Furthermore, because the feedback capacitor 121 is often adjusted to compensate for process variations inherent in the fabrication in integrated circuit (IC) devices, performing additional temperature compensation with the capacitor adds even more complexity to the control of the variable capacitor since two separate compensations must be performed concurrently on the same circuit element.

FIG. 1B shows an amplifier circuit 150 including an op-amp 151, input resistors 152(1)-152(n) having corresponding resistances of $r_1$-$r_n$, and a feedback element 153 having an impedance of $Z_f$. The amplifier circuit 150 can be implemented as an inverting gain stage or an inverting voltage integrator. The amplifier circuit 150 has inputs to receive n input voltages $V_1$-$V_n$ via input resistors 152(1)-152(n) coupled to an inverting input of the op-amp 151. The op-amp 151 has an output to generate an output voltage signal V_out, and has a non-inverting input coupled to ground potential. The feedback element 153 is coupled between the inverting input of the op-amp 151 and the output of the op-amp 151.

The output voltage V_out of the amplifier circuit 150 under a default temperature is given as:

$$V\_out(s) = -Z_f \sum_{k=1}^{n} \frac{V_k(s)}{r_{k\_0}} = -Z_f \sum_{k=1}^{n} g_{k\_0} V_k(s) \quad (2)$$

where $g_{k\_0}=1/r_{k\_0}$, and $r_{k\_0}$ represents the resistance of a corresponding resistor under the default temperature. For example, resistor 152(2) has a resistance of $r_{2\_0}$ under the default temperature.

Similar to circuit 100 of FIG. 1A, the output of the amplifier circuit 150 is subject to variations due to temperature. Furthermore, it is difficult to adjust for the temperature variations by individually tuning resistors 152(1)-152(n).

DETAILED DESCRIPTION

Present embodiments are described below in the context of compensating for temperature variations in filter circuits such as integrators for simplicity only. It is to be understood that the present embodiments are equally applicable for temperature compensation of any suitable circuit or device that includes a plurality of resistors and a number of capacitors. In the following description, for purposes of explanation, specific nomenclature is set forth to provide a thorough understanding of the ideas presented in this disclosure. In other instances, well-known circuits and devices are shown in block diagram form to avoid obscuring the disclosure unnecessarily. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and signals and signaling paths shown or described as being differential may also be single-ended. Further, the logic states of various signals described herein are exemplary and therefore may be reversed or otherwise modified as generally known in the art. Accordingly, the present embodiments are not to be construed as limited to specific examples described herein but rather includes within its scope all embodiments defined by the appended claims.

Present embodiments implement temperature compensation functions for circuits such as filters by adjusting the resistive value of a single designated resistive element, for example, in contrast to prior temperature compensation techniques that adjust the values of multiple resistors and/or capacitors. More specifically, present embodiments allow the transfer function of an op-amp circuit having a number of resistors and capacitors (hereinafter referred to as an op-amp RC circuit) to be shifted in the frequency domain in response to temperature variations with minimal alteration in the characteristic shape of the transfer function, thereby maintaining a relatively constant transfer function across a range of operating temperatures. For one embodiment, adjustment in the value of a circuit's single designated resistive element can shift circuit's the transfer function by +100 Hz in the frequency domain, which in turn shifts the circuit's −3 dB or cutoff frequency by +100 Hz. As used herein, the op-amp RC circuit can be implemented as a voltage integrator circuit, a voltage summing circuit, or a filter circuit.

Figure 2A:
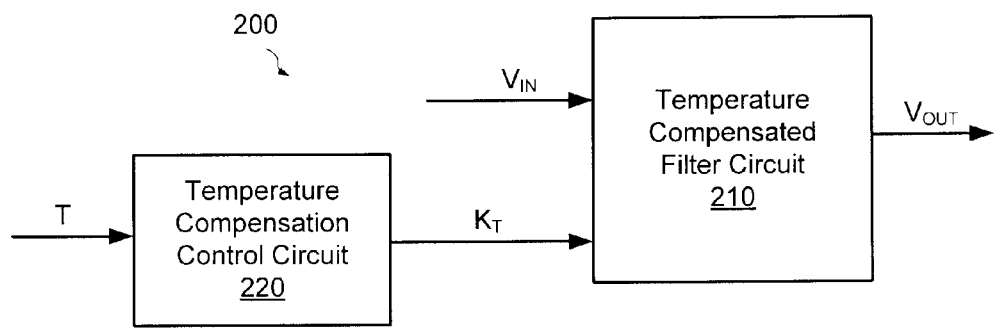
FIG. 2A is a functional block diagram of a temperature compensated system including a filter circuit and a temperature compensation control circuit within which present embodiments may be implemented.

FIG. 2A is a functional block diagram of a system 200 having a temperature compensated filter circuit 210 and a temperature compensation control circuit 220. As used herein, the term "temperature compensation" refers to adjusting a circuit output to maintain a relatively constant transfer function across temperature variations. The term "temperature compensated circuit" refers to a circuit that performs or is configurable to perform temperature compensation functions. For the purposes of this disclosure, maintaining a transfer function "relatively constant" across temperature variations means to limit the temperature-dependence of the transfer function for temperature variations within a specified temperature range. For some embodiments, the temperature compensation process maintains the transfer function of the circuit to be close (e.g. within 0.2 dB in magnitude and within 5° in phase) to the transfer function achieved by the circuit under a default temperature. In some cases, the default temperature is the midpoint in the specified temperature range. Accordingly, circuit performance parameters such as −3 dB frequency and bandwidth are also maintained to be close (e.g. within 5% or 10%) to those achieved under the default temperature.

The filter circuit 210 performs one or more signal processing functions on an input voltage $V_{IN}$ to generate an output voltage $V_{OUT}$. For some embodiments of the filter circuit 210, the one or more signal processing functions are removing unwanted frequency components from the input voltage $V_{IN}$. In some cases, the unwanted frequency components are those below a certain frequency threshold. In other cases, the unwanted frequency components are those above a certain frequency threshold or those between two specified frequency thresholds. The temperature compensation control circuit 220 detects a temperature value T, and in response thereto generates a temperature compensation control signal $K_T$. The temperature value T indicates an operating temperature of system 200. For some embodiments of the system 200, the control circuit 220 is physically located close to the filter circuit 210 so that T is also indicative of the filter circuit's temperature. The temperature compensation control signal $K_T$ is generated in a manner such that variations in the control signal $K_T$ are indicative of variations in the temperature value T. For some embodiments of the temperature compensation control circuit 210, $K_T$ varies linearly with the temperature value T. In other embodiments, $K_T$ is a digital signal and when the control circuit 220 detects variations of T in excess of a minimum temperature variation threshold, the control circuit 220's output $K_T$ is correspondingly varied.

The temperature compensated filter circuit 210 has an input to receive the temperature compensation control signal $K_T$, which in turn is used to adjust the output voltage $V_{OUT}$. More specifically, the filter circuit 210 is configured to automatically adjust $V_{OUT}$ in response to $K_T$ to maintain a relatively constant transfer function across temperature variations as a part of a temperature compensation process. For some embodiments of the system 200, a temperature detection process is performed asynchronously (i.e. without a clock signal). Asynchronous temperature detection is desirable because it obviates the need for complicated circuits (such as phase locked loop (PLL) circuits) to generate clock signals. For one or more embodiments of the control circuit 220, an analog-to-digital converter (ADC) included therein (not shown for simplicity) performs an analog to digital conversion asynchronously (i.e. without the need for a clock or an enable input signal) to generate the control signal $K_T$. For those embodiments, the ADC generates an updated $K_T$ value whenever an input voltage indicates a change in temperature value T exceeding a specified threshold value.

Figure 2B:
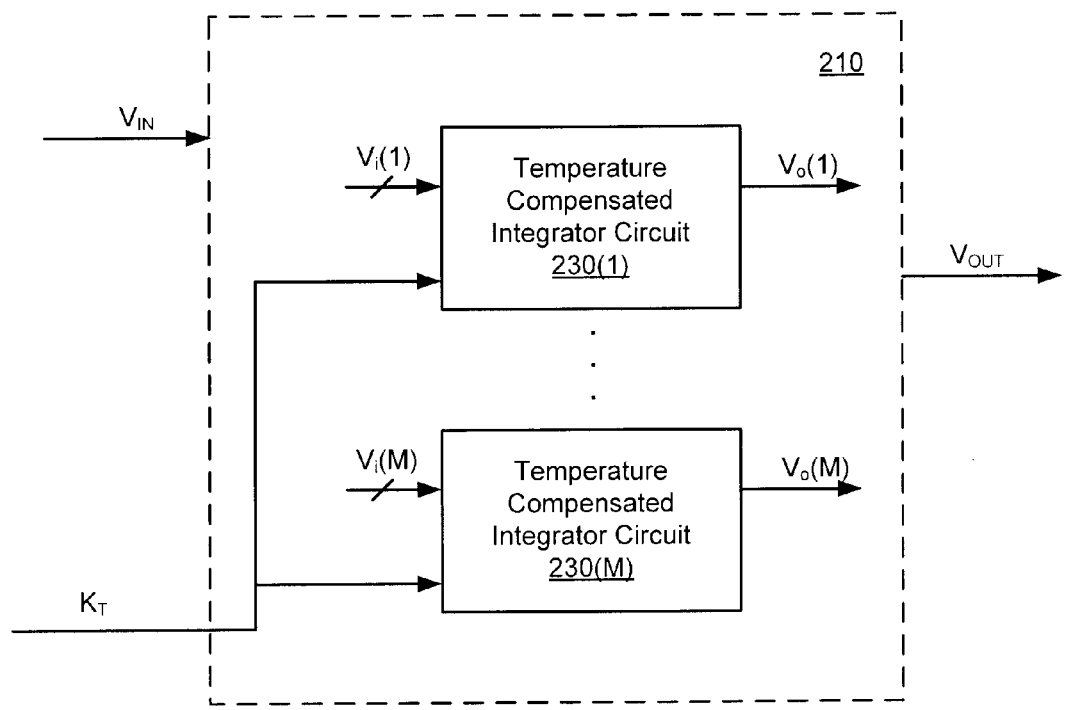
FIG. 2B is a functional block diagram of one embodiment of the temperature compensated filter circuit of FIG. 2A.

FIG. 2B shows one embodiment of the temperature compensated filter circuit 210 in more detail. The filter circuit 210 includes any number of temperature compensated integrator circuits 230(1)-230(M). Each integrator circuit 230(i) (where $1 \leq i \leq M$) has one or more inputs to receive one or more corresponding input voltages $V_i(i)$ and generates an output voltage $V_O(i)$ that indicates a time integral of the input voltage(s). Each integrator circuit 230(i) is configurable to adjust its output $V_O(i)$ in response to the temperature compensation control signal $K_T$ to maintain its transfer function relatively constant across temperature variations. For some embodiments of the integrator circuit 230(i), adjusting $V_O(i)$ in response to the temperature compensation control signal $K_T$ is accomplished by modifying the resistance value of a single resistive element (not shown for simplicity) contained in the integrator circuit 230(i) in response to $K_T$.

Figure 3A:
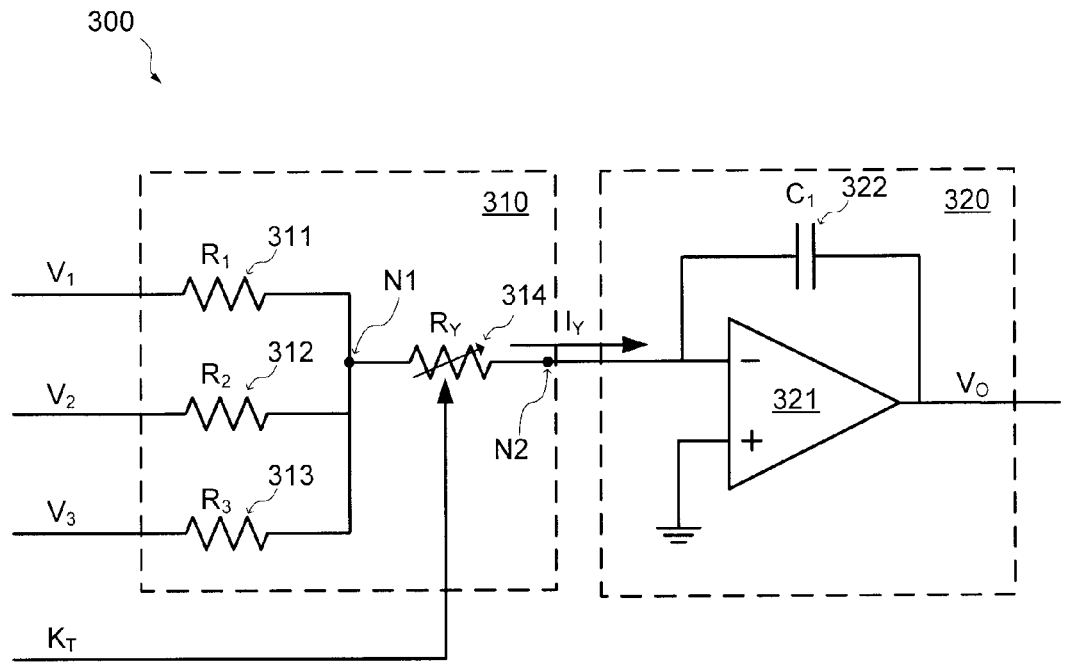
FIG. 3A is a circuit diagram of one embodiment of the temperature compensated integrator circuit of FIG. 2A.

FIG. 3A is a circuit diagram of a temperature compensated integrator circuit 300 that is one embodiment of the integrator circuits 230(1)-230(M) of FIG. 2B. The integrator circuit 300 includes a resistive stage 310 and an amplification stage 320. The resistive stage 310 includes inputs to receive three input voltage signals ($V_1$, $V_2$, and $V_3$), a control terminal to receive the temperature compensation control signal $K_T$, an output coupled to the amplification stage 320, three input resistors 311-313, and a single designated compensation resistive element 314. The input resistors 311, 312, and 313 are coupled between an intermediate node N1 and respective input voltages $V_1$, $V_2$, and $V_3$, and have corresponding resistance values of $R_1$, $R_2$, and $R_3$. Although resistive stage 310 is depicted in FIG. 3A as having 3 input resistors coupled to receive 3 input voltages, for actual embodiments, resistive stage 310 can include any number of input resistors coupled to receive a corresponding number of input voltages.

The designated compensation resistive element 314, which is coupled between the intermediate node N1 and an output terminal N2, has an adjustable resistance $R_Y$ that can be controlled by the control signal $K_T$. More specifically, the resistance $R_Y$ of the single compensation resistive element 314 can be adjusted in response to control signal $K_T$ to compensate for temperature variations of other circuit elements (e.g., resistors 311, 312, and 313) of the resistive stage 310 or the amplification stage 320. In this manner, temperature compensation functions can be performed on integrator circuit 300 by adjusting the resistive value of a single resistive element 314. Although depicted in FIG. 3A as a single resistor, compensation resistive element 314 can be implemented using any number of physical resistors coupled between (e.g., in series, in parallel, or a combination thereof) two selected potentials.

The output of resistive stage 310 generates an output current $I_Y$ that is provided as an input to the amplification stage 320. The amplification stage 320 includes an op-amp 321 having a first input (non-inverting input) coupled to ground potential, a second input (inverting input) coupled to the output terminal N2 of the resistive stage 310, and an output that generates an output voltage $V_O$. A feedback capacitor 322 having a capacitive value of $C_1$ is coupled between the output and the non-inverting input of op-amp 321.

A default resistance value of compensation resistive element 314, $R_{Y\_DEF}$, is achieved when the control signal $K_T$ is of a value indicative of a default temperature. For some embodiments, the default temperature is a midpoint in a predetermined operational temperature range for integrator circuit 300. For example, if the predetermined operational temperature range is between 0 and 50° C., the default temperature value is 25° C. The default temperature value and the temperature range may vary based on an expected operating environment of the integrator circuit 300. For example, if integrator circuit 300 is deployed in audio headphones that are in close proximity to the human body, the default temperature may be set to approximately 36° C. For certain embodiments, the resistance of the compensation resistive element 314 is adjustable in discrete steps and has a resistance value range of:

$$R_{Y\_DEF} \pm k \cdot \Delta \quad (3)$$

where $\Delta$ is the step value in the adjustment of the resistance value, and k is the maximum number of steps in the adjustment of the resistance value.

As mentioned above, the integrator circuit 300 is configurable to maintain a relatively constant transfer function over a range of operating temperatures by adjusting a single resistive element (i.e., the compensation resistive element 314), thereby simplifying temperature compensation functions over prior approaches that attempt to adjust the characteristic values of multiple resistive and/or capacitive elements.

Figure 1A:
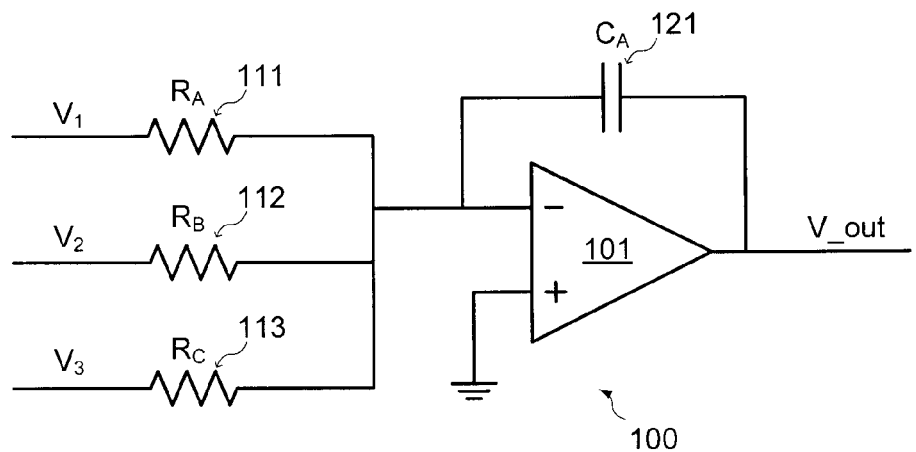
FIG. 1A is a circuit diagram of a typical three-input amplifier circuit.

It may be desirable for the output characteristics of the temperature compensated integrator circuit 300 to match that of a typical inverting integrator (such as circuit 100 of FIG. 1A) to facilitate the replacement of typical inverting integrators with present embodiments of integrator circuit 300 for various devices and/or applications. In other words, it may be desirable for the temperature compensated integrator circuit 300 to have the following output characteristic:

$$V_{out}(t) = -\frac{1}{C_A} \int_0^t \left( \frac{V_1(t)}{R_A} + \frac{V_2(t)}{R_B} + \frac{V_3(t)}{R_C} \right) dt + V_{OUT}(0) \quad (4)$$

where $R_A$, $R_B$, and $R_C$ correspond to resistance values of the input resistors 111-113 of FIG. 1A, and $C_A$ corresponds to the capacitance of the capacitor 121 of FIG. 1A. For the temperature compensated integrator circuit 300 to achieve the transfer function given by equation (4), the circuit element values of integrator circuit 300 can be represented in terms of the values of a standard inverting integrator such as circuit 100 of FIG. 1A:

$$C_1 = \alpha C_A \quad (5)$$

$$R_1 = \lambda R_A \quad (6)$$

$$R_2 = \lambda R_B \quad (7)$$

$$R_3 = \lambda R_C \quad (8)$$

where α is a scaling coefficient for the feedback capacitor 322 relative to capacitor 121 of FIG. 1A, and λ is a scaling coefficient for the input resistors 311-313 relative to the input resistors 111-113 of FIG. 1A. The scaling coefficients α and λ, as well as the default resistance $R_{Y\_DEF}$ of designated compensation resistive element 314, can be selected so that the behavior of the integrator circuit 300 matches that of inverting integrator 100 of FIG. 1A under the default temperature. Specifically, as long as α, λ, and $R_{Y\_DEF}$ satisfy the following conditions, the output voltage $V_O$ of the integrator circuit 300 will be given by equation (4):

$$\alpha\lambda < 1; \alpha > 0; \lambda > 0 \quad (9)$$

$$R_{Y\_DEF} = \left(\frac{1}{\alpha} - \lambda\right)\left(\frac{1}{1/R_1 + 1/R_2 + 1/R_3}\right) \quad (10)$$

Thus, for some embodiments, the single compensation resistive element 314 has default impedance value $R_{Y\_DEF} = \eta R_{IN}$ at a default operating temperature, where η is scaling factor equal to $$\left(\frac{1}{\alpha} - \lambda\right)$$

and $R_{IN}$ is equal to $R_1 \| R_2 \| R_3$.

During configuration of the integrator circuit 300, the values $R_A$, $R_B$, and $R_C$ may first be calculated based on the desired overall behavior of the integrator circuit. Then, coefficients α and β, capacitance value $C_1$, resistance values $R_1$, $R_2$, $R_3$, and default resistance value $R_{Y\_DEF}$ of designated compensation resistive element 314 can be calculated based on equations (5)-(10).

Then, during the operation of the integrator circuit 300, the compensation resistive element 314 automatically adjusts its resistance value $R_Y$ based on the compensation signal $K_T$. For some embodiments, $K_T$ is an analog signal, and the resistance of the resistive element 314 varies according to the voltage of $K_T$. For other embodiments, $K_T$ is a digital signal that operates one or more switches provided within the resistive element 314 to modify its resistance value $R_Y$.

Figure 3B:
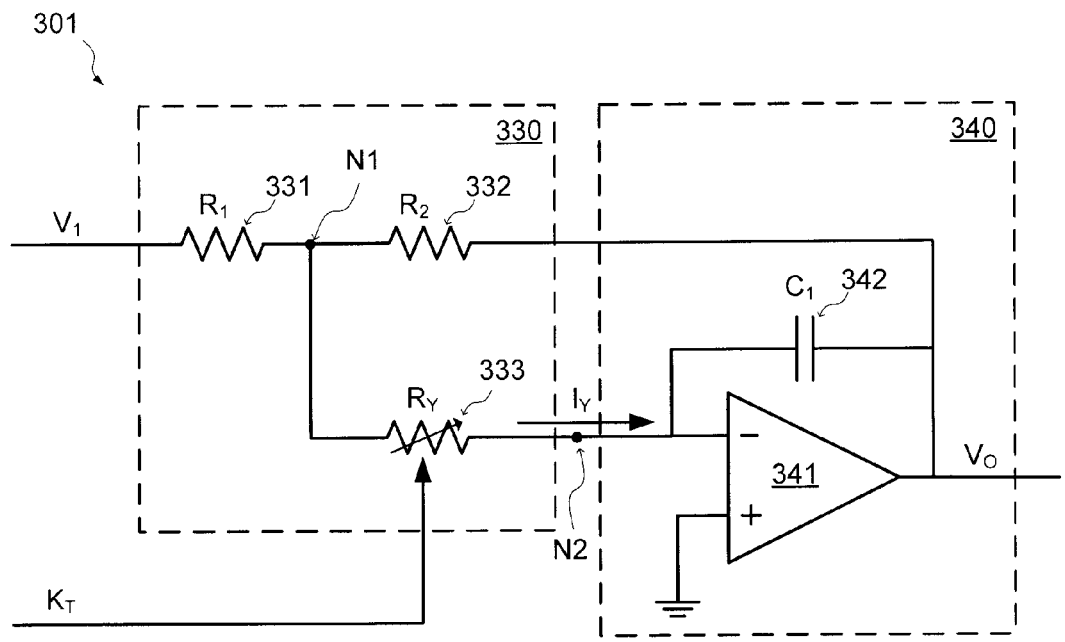
FIG. 3B is a circuit diagram of a particular embodiment of the temperature compensated integrator circuit of FIG. 2A as a lossy integrator.

FIG. 3B is a circuit diagram of a temperature compensated lossy integrator circuit 301 that is another embodiment of the integrator circuits 230(1)-230(M) of FIG. 2B. The integrator circuit 301 includes a resistive stage 330 and an amplification stage 340. The resistive stage 330 includes an input to receive input voltage signal $V_1$, an input coupled to the output of integrator circuit 301 to receive an output voltage $V_O$, a control terminal to receive the temperature compensation control signal $K_T$, an output coupled to the amplification stage 340, input resistors 331 and 332, and a single compensation resistive element 333. The input resistor 331 is coupled between the input voltage $V_1$ and an intermediate terminal N1. The input resistor 332 is coupled between the output voltage $V_O$ and the intermediate terminal N1.

The compensation resistive element 333 is coupled between the intermediate terminal N1 and an output terminal N2 of the resistive stage 330 that provides an output current $I_Y$. Similar to compensation resistive element 314 of FIG. 3A, the compensation resistive element 333 has an adjustable resistance of $R_Y$ that can be controlled by the control signal $K_T$. More specifically, $R_Y$ can be adjusted in response to the control signal $K_T$ to compensate for temperature variations of other circuit elements (e.g., resistors 331 and 332) of the resistive stage 330 or the amplification stage 340. In this manner, temperature compensation functions may be performed on integrator circuit 301 by adjusting the resistance value of a single resistive element 333. The feedback resistor is coupled between the input resistor 331 and an output voltage $V_O$.

The amplification stage 340 includes an op-amp 341 having a first input (non-inverting input) coupled to ground potential, a second input (inverting input) coupled to the output terminal N2 of resistive stage 330, and an output that generates an output voltage $V_O$. The amplification stage 340 also includes a feedback capacitor 342 coupled between the output and the non-inverting input of the op-amp 341.

The integrator circuit 301 is configurable to adjust its output voltage $V_O$ to maintain a relatively constant transfer function over temperature variations by automatically adjusting the resistive value of the compensation resistive element 333 in response to the control signal $K_T$. By adjusting a single resistive element (i.e. the compensation resistive element 333) to maintain a relatively constant transfer function over a range of temperatures, the temperature compensation process of integrator circuit 301 is simplified over prior approaches that adjust multiple resistive and/or capacitive elements.

Figure 3C:
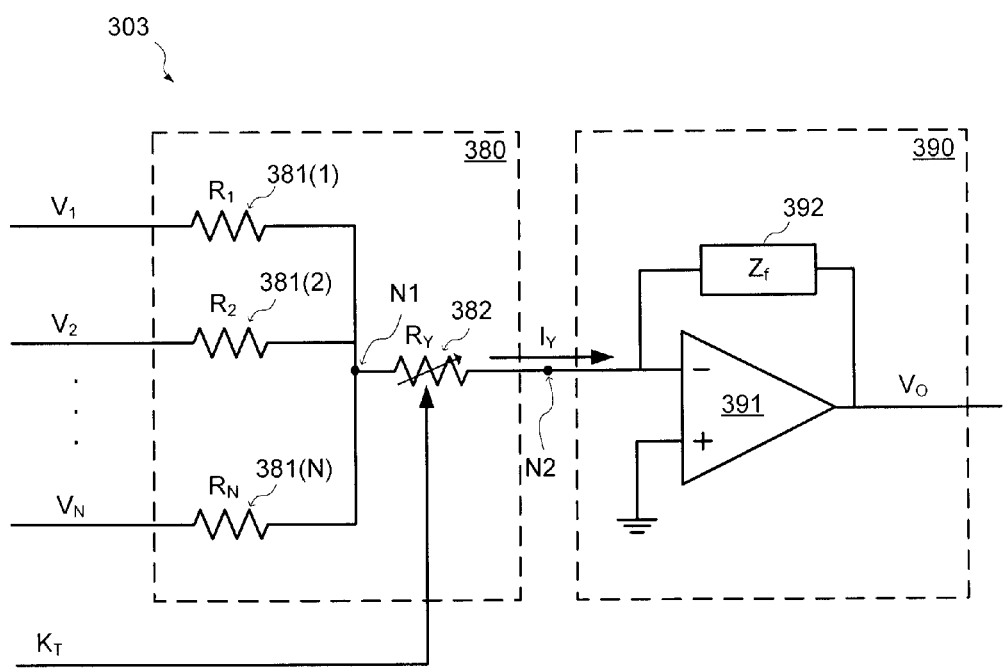
FIG. 3C is a circuit diagram of another embodiment of the temperature compensated integrator circuit of FIG. 2A.

FIG. 3C is a circuit diagram of a temperature compensated circuit 303, which is another embodiment of the integrator circuits 230(1)-230(M) of FIG. 2B. The circuit 303 includes a resistive stage 380 and an amplification stage 390. The resistive stage 380 includes a selectable number (N) of inputs to receive N input voltage signals $V_1$-$V_N$, a control terminal to receive a temperature compensation control signal $K_T$, an output coupled to the amplification stage 390, N input resistors 381(1)-381(N), and a designated compensation resistive element 382. The input resistors 381(1)-381(N) are coupled between an intermediate node N1 and respective input voltages $V_1$-$V_N$, and have corresponding resistance values of $R_1$-$R_N$.

The compensation resistive element 382, which is coupled between the intermediate node N1 and an output terminal N2 of resistive stage 380, has an adjustable resistance $R_Y$ that can be controlled by the control signal $K_T$, which as described above is indicative of temperature variations. More specifically, the resistance $R_Y$ of the compensation resistive element 382 can be adjusted in response to $K_T$ to compensate for temperature variations of circuit elements within the circuit 303. In this manner, temperature compensation functions can be performed on circuit 303 by adjusting the resistive value of a single resistive element 382. A default resistance value of compensation resistive element 382, $R_{Y\_DEF}$, is achieved when the control signal $K_T$ is of a value indicative of a default temperature. Although depicted in FIG. 3C as a single resistor, compensation resistive element 382 can be implemented using any number of physical resistors coupled between (e.g., in series, in parallel, or a combination thereof) two selected potentials.

The output of resistive stage 380 generates an output current $I_Y$ that is provided as an input to the amplification stage 390. The amplification stage 390 includes an op-amp 391 having a first input (non-inverting input) coupled to ground potential, a second input (inverting input) coupled to the output terminal N2 of the resistive stage 380, and an output that generates an output voltage $V_O$. A feedback element 392 having an impedance value of $Z_f$ is coupled between the output and the non-inverting input of op-amp 391. The feedback element 392 can be a capacitor, a resistor, an inductor, or any combination (series or parallel) thereof.

Figure 1B:
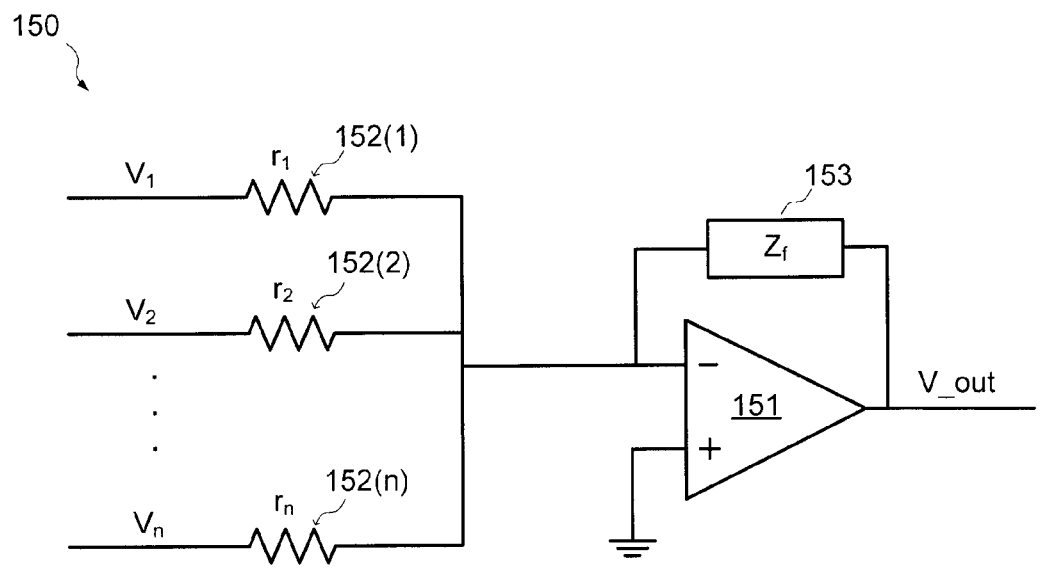
FIG. 1B is a circuit diagram of a generic multiple input amplifier circuit.

The output voltage $V_O$ of the circuit 303 is given by:

$$V_O(s) = -\frac{Z_f}{1+\left(\sum_{k=1}^{N} G_{k\_0}\right)/G_{Y\_0}} \sum_{k=1}^{N} G_{k\_0} V_k(s) \quad (11)$$

where $G_{k\_0}=1/R_{k\_0}$; k=1, . . . , n; and $G_{Y\_0}=1/R_{Y\_DEF} \cdot R_{k\_0}$ denotes the resistance value of a resistive element under the default temperature. For example, the resistive element 381(2) has a resistance value of $R_{2\_0}$ under the default temperature. It may be desirable for the output characteristics of the temperature compensated circuit 303 to match that of a typical N-input integrator (such as integrator 150 of FIG. 1B) to facilitate the replacement of circuit 150 with present embodiments of circuit 303 for various devices and/or applications. In other words, it may be desirable for the temperature compensated circuit 303 to have the following output voltage:

$$V_O(s) = -Z_f \sum_{k=1}^{N} g_{k\_0} V_k(s) \quad (12)$$

The above output characteristic will be achieved if the following conditions are satisfied:

$$G_{Y\_0} > \sum_{k=1}^{N} g_{k\_0} \quad (13)$$

$$R_{k\_0} = \left(1 - \frac{\sum_{k=1}^{N} g_{k\_0}}{G_{Y\_0}}\right) r_{k\_0} \quad (14)$$

For temperature variations, the resistance's dependence on temperature can be represented by a linear model in the following fashion:

$$R_k = (1+\gamma \cdot \Delta T) R_{k0} \quad (15)$$

where $\Delta T$ represents temperature variation from a default temperature value and where $\gamma$ is a coefficient that characterizes how resistance $R_k$ depends on $\Delta T$ (i.e. a temperature coefficient). The resistance of the compensation resistive element 382 $R_Y$ is of a value that is properly calculated to compensate for temperature variations of other circuit elements within the circuit 303. $R_Y$ can be expressed as the default resistance $R_{Y\_DEF}$ multiplied by a temperature-variation dependent compensation factor $\beta$ in the following manner:

$$R_Y = \beta(\Delta T) R_{Y\_DEF} \quad (16)$$

where $\Delta T$ represents a temperature variation compared to the default temperature. $\beta$ is equal to 1 for a temperature variation of 0, thus yielding $R_Y = R_{Y\_DEF}$ under the default temperature. $\beta$ can be determined based on the temperature dependences of the resistors 381(1)-381(N). More specifically, an appropriate value for compensation factor $\beta$ will establish the following relationship:

$$r_k = r_{k\_0} \quad (17)$$

where k=1, . . . , N. Thus, compensation factor $\beta$ can be found using the following equation:

$$r_k = \left(1 + \beta \frac{\sum_{k=1}^{N} g_{k\_0}}{G_{Y\_0} - \sum_{k=1}^{N} g_{k\_0}}\right)\left(1 - \frac{\sum_{k=1}^{N} g_{k\_0}}{G_{Y\_0}}\right)(1+\gamma \cdot \Delta T) r_{k\_0} = r_{k\_0} \quad (18)$$

which yields:

$$\beta(\Delta T) = 1 + \frac{G_{Y\_0}}{\sum_{k=1}^{N} g_{k\_0}}\left(1 - \frac{1}{1+\gamma \cdot \Delta T}\right) \approx 1 - \left(\frac{G_{Y\_0}}{\sum_{k=1}^{N} g_{k\_0}}\right) \gamma \cdot \Delta T \quad (19)$$

For other embodiments of the circuit 303, the compensation resistive element 382 is adjusted for circuit element variations other than temperature variation (e.g. process variation). Accordingly, the compensation factor $\beta$ corresponds is dependent upon, for example, process variations of circuit elements within circuit 303.

Figure 4A:
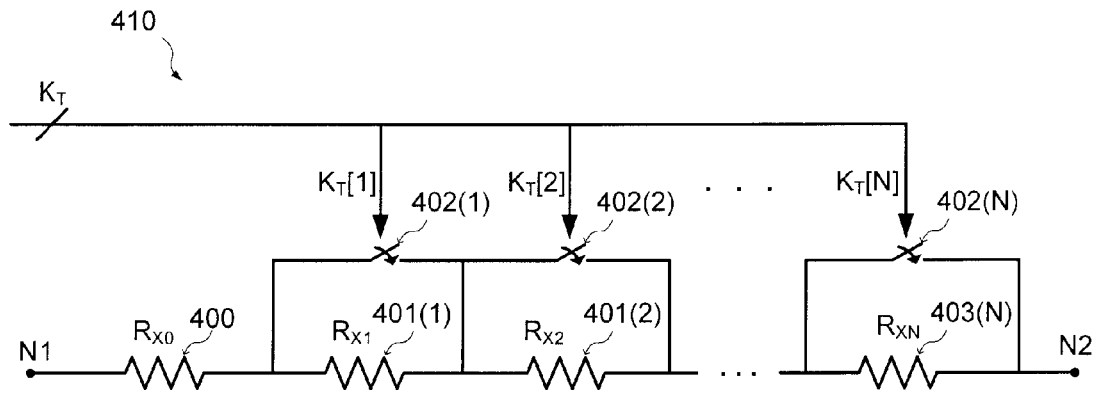
FIG. 4A is a circuit diagram of one embodiment of the compensation resistive element within the temperature compensated integrator circuit of FIG. 3A.

FIG. 4A is a circuit diagram of a compensation resistive element 410 that is one embodiment of the compensation resistive element 314 of FIG. 3A. Resistive element 410 includes a resistor 400 coupled in series with a selectable number (N) of compensation resistors 401(1)-401(N) via corresponding switches 402(1)-402(N) between nodes N1 and N2, where N can be any integer number greater than one. For some embodiments, N is selected according to the desired adjustment range of the compensation resistive element 410. The resistor 400 has a resistance value of $R_{X0}$, and compensation resistors 401(1)-401(N) have resistance values of $R_{X1}$-$R_{XN}$, respectively. For the illustrated embodiment, $K_T$ is a multi-bit digital control signal that controls the conductive states of switches 402(1)-402(N) so that the total resistance value of the compensation resistive element 410 can be adjusted by selectively closing switches 402(1)-402(N) to bypass (e.g., shunt) corresponding compensation resistors 401(1)-401(N) in response to the value of $K_T$. For one embodiment, a combination of $R_{X0}$ and one or more of $R_{X1}$-$R_{XN}$ can be selected to achieve the default resistance $R_Y$= $R_{Y\_DEF}$ of the compensation resistive element 410 (i.e., when no temperature compensation is being performed). By having $R_Y$ correspond to a combination of $R_{X0}$ and one or more of $R_{X1}$-$R_{XN}$, the resistance of the compensation resistive element 410 can be adjusted to be above or below the default resistance of $R_{Y\_DEF}$.

More specifically, compensation resistors 401(1)-401(N) are each connected in parallel with a corresponding one of switches 402(1)-402(N), as depicted in FIG. 4A. Each of the switches 402(1)-402(N) receives a corresponding bit of the control signal $K_T$ that causes the switch to operate in either a closed state (i.e., in a low impedance state) or an open state (i.e., in a high impedance state). For example, switch 402(1) receives $K_T[1]$, switch 402(2) receives $K_T[2]$, and switch 402(N) receives $K_T[N]$. When any of switches 402 is in a closed state, the corresponding parallel resistor 401 is bypassed and therefore its resistance value does not contribute to the total resistance value of the compensation resistive element 410. For example, when switch 402(2) is closed, the resistance $R_{X2}$ of compensation resistor 401(2) does not factor into the overall resistance of the compensation resistive element 410. Thus, the overall resistance of the compensation resistive element 410 can be adjusted for temperature variations by selectively controlling the conductive states of switches 402(1)-402(N) in response to $K_T$. The total resistance of the compensation resistive element 410 is given by:

$$R_{TOT} = R_{X0} + \overline{K_T[1]} \cdot R_{X1} + \overline{K_T[2]} \cdot R_{X2} + \ldots + \overline{K_T[N]} \cdot R_{XN} \quad (20)$$

where the switches 402(1)-402(N) are closed for an asserted signal of a corresponding bit of the control signal $K_T$.

For some embodiments, each of the compensation resistors 402(1)-402(N) is a power of two multiple (i.e. 1×, 2×, 4×, 8×, etc) of a baseline resistance value. For example, for N=4 and a baseline resistance value of 50Ω, the resistance of the compensation resistive element 410 is given by:

$$R_{TOT} = R_{X0} + (\overline{K_T[1]} + 2 \cdot \overline{K_T[2]} + 4 \cdot \overline{K_T[3]} + 8 \cdot \overline{K_T[3]}) \cdot 50\Omega \quad (21)$$

Accordingly, for these embodiments, the granularity of adjustment in $R_{TOT}$ is the baseline resistance value.

Figure 4B:
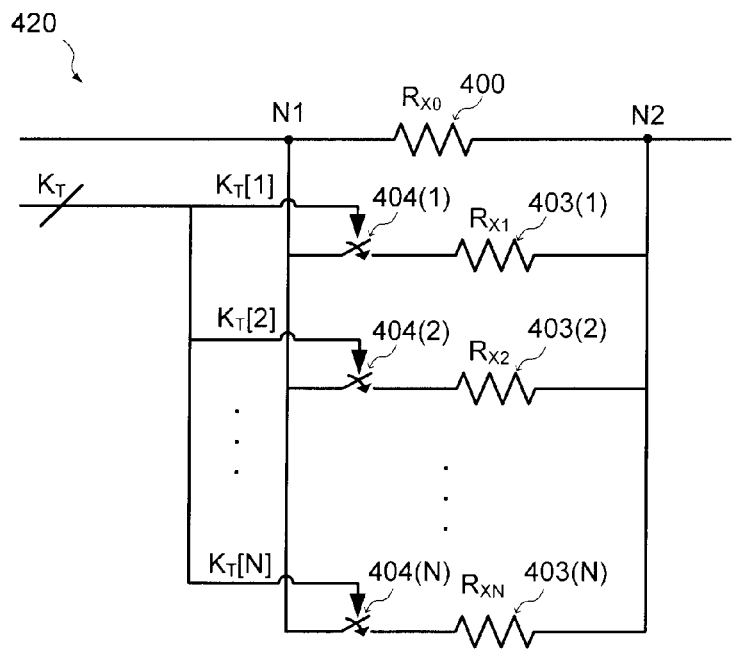
FIG. 4B is a circuit diagram of another embodiment of the compensation resistive element within the temperature compensated integrator circuit of FIG. 3A.

FIG. 4B is a circuit diagram of a compensation resistive element 420 that is another embodiment of the compensation resistive element 314 of FIG. 3A. The compensation resistive element 420 includes resistor 400 coupled in parallel with a selectable number (N) of compensation resistors 403(1)-403(N) via corresponding switches 404(1)-404(N) between nodes N1 and N2. The resistor 400 has a resistance value of $R_{X0}$, and compensation resistors 403(1)-403(N) have resistance values of $R_{X1}$-$R_{XN}$, respectively. Each of switches 404(1)-404(N) can be configured to operate in either a closed state or an open state in response to a corresponding bit of signal $K_T$. In this manner, the switches 404(1)-404(N) can be used to selectively couple or decouple corresponding compensation resistors 403(1)-403(N) between nodes N1 and N2 of the compensation resistive element 420. The resistance value of the compensation resistive element 420 is given by:

$$R_{TOT} = \frac{1}{1/R_{X0} + K_T[1]/R_{X1} + K_T[2]/R_{X2} + \ldots + K_T[N]/R_{XN}} \quad (22)$$

Other embodiments of the compensation resistive element 420 may be implemented using a combination of switch-resistor pairs connected in parallel and switch-resistor pairs connected in series.

Figure 5:
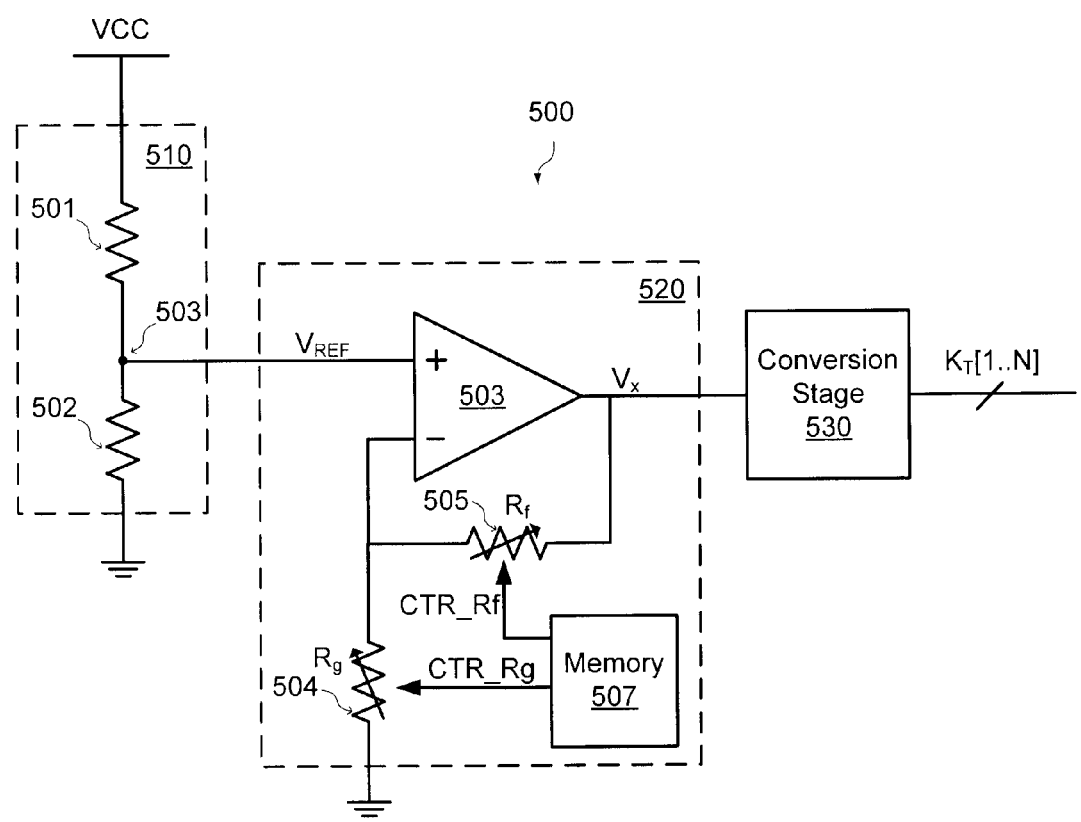
FIG. 5 is a block diagram of one embodiment of the temperature compensation control circuit of FIG. 2A.

FIG. 5 shows a temperature compensation control circuit 500 that is one embodiment of the temperature compensation control circuit 220 of FIG. 2A. Control circuit 500 generates a multi-bit digital control signal $K_T$ that controls temperature compensation functions of the filter circuit 210 and any other circuit elements that receive $K_T$. Control circuit 500 includes a reference voltage stage 510, a temperature detection stage 520, and a conversion stage 530. The reference voltage stage 510 includes two resistors 501 and 502 coupled in series between a supply voltage VCC and ground potential, and provides a reference voltage $V_{REF}$ for temperature detection stage 520 at node 503. For some embodiments, the reference voltage $V_{REF}$ is generated externally and provided to temperature detection stage 520 via corresponding signal lines.

Temperature detection stage 520 includes an op-amp 503, a first calibration resistor 504 having a temperature-dependent resistance value of $R_g$, a second calibration resistor 505 having a temperature-independent resistance value of $R_f$, and a memory element 507. Op-amp 503 includes a non-inverting input to receive $V_{REF}$, an inverting input coupled to ground potential via the first calibration resistor 504, and an output to generate an output voltage $V_x$. The second calibration resistor 505 is coupled between the output and the inverting input of op-amp 503. The resistance value $R_f$ of the second calibration resistor 505 is controlled by a calibration control signal CTR_Rf, and the resistance value $R_g$ of the first calibration resistor 504 is controlled by a calibration control signal CTR_Rg. For some embodiments, calibration control signals CTR_Rf and CTR_Rg are stored in memory element 507, which can be any suitable non-volatile memory element (e.g., PROM, EPROM, Flash Memory, fuses, and so on).

The output voltage $V_x$ generated by temperature detection stage 520 depends on a ratio between $R_g$ and $R_f$, and is thus a temperature-dependent output voltage that can be used to indicate variations in the operating temperature. More specifically, the output voltage $V_x$ generated by op-amp 503 is given by the following equation:

$$V_x = \left(1 + \frac{R_f}{R_g}\right) \cdot V_{REF} \quad (23)$$

For some embodiments, resistive elements 501 and 502 are made of the same material and vary in the same fashion with temperature, thus causing $V_{REF}$ to be independent of temperature. $R_g$ is also independent of temperature. Accordingly, $V_x$ varies with temperature proportionally with $R_f$'s variation with temperature:

$$\frac{\partial V_x}{\partial T} \propto \frac{\partial R_f}{\partial T} \quad (24)$$

For some embodiments, the resistance values $R_f$ and $R_g$ are adjusted to selected values by altering the values of CTR_Rf and CTR_Rg during a calibration mode of the control circuit 500, and then the corresponding value of control signals CTR_Rf and CTR_Rg are stored in memory element 507. For one embodiment, the first calibration resistor 504 is implemented as a series combination of a first resistive element whose resistance has a positive temperature coefficient and a second resistive element whose resistance has a negative temperature coefficient. In this manner, when properly adjusted during the calibration mode, $R_g$ is temperature independent because the temperature variations of the resistances of the first and second resistive elements that form the first calibration resistor 504 cancel each other. At least one of the first and second resistive elements is adjustable during the calibration process to cause $R_g$ to be temperature-independent. For some embodiments, the first resistive element is formed using a suitable N-well material and the second resistive element is made of polysilicon material.

The conversion stage 530 receives the temperature-dependent voltage $V_x$ generated by temperature detection stage 520 and converts $V_x$ into a digital signal representative of the temperature compensation control signal $K_T$, which as described above can be used by temperature compensated filter circuits such as filter circuit 210 of FIG. 2A to maintain a transfer function that is relatively independent of temperature variations. For some embodiments, conversion stage 530 includes an analog-to-digital converter (ADC) that converts $V_x$ to the digital control signal $K_T[1 \ldots N]$. As mentioned previously, for one or more implementations of the conversion stage 530, the ADC is configured to sample $V_x$ asynchronously (without the need for a clock or enable input signal) to generate the control signal $K_T$. Advantages for the ADC operating asynchronously include the ability to operate without a noisy clock signal, lower circuitry overhead (lack of need for dedicated clock signal lines or clock generation circuitry such as PLLs) compared with synchronous ADCs, and lower power consumption, and so on. For these embodiments, the ADC generates an updated $K_T$ value whenever an input voltage indicating a detected temperature value changes by more than a specified threshold value, thereby lowering power consumption by updating $K_T$ only when necessary.

For one or more embodiments, the calibration mode includes adjusting the resistance values of $R_f$ and $R_g$ using signals CTR_Rf and CTR_Rg until a desired output characteristic is achieved from a circuit (e.g. filter circuit 210 or integrator circuit 300) that receives the $K_T$ to adjust a corresponding output signal. For such embodiments, the calibration mode may be performed by monitoring the output of a single circuit (out of a plurality of circuits) that receives the control signal $K_T$. The single circuit may be a random one of the plurality of circuits that receive the control signal $K_T$ or it may be a dedicated circuit used for the calibration mode. For some embodiments, the calibration mode is performed at a default temperature corresponding to a midpoint in a predetermined temperature compensation range, and the values of $R_f$ and $R_g$ are adjusted until a desired output voltage characteristic is obtained. For embodiments in which control circuit 500 is used to provide $K_T$ to integrator circuit 300 (see also FIG. 3A), the calibration mode may be performed by sampling the value of the control signal $K_T$ generated by control circuit 500, and then identifying the value of $K_T$ that causes the compensation resistive element 314 of integrator circuit 300 to have the default resistance value of $R_{Y\_DEF}$. More specifically, during the calibration mode, the values $R_f$ and $R_g$ are adjusted by adjusting the respective control signals CTR_Rf and CTR_Rg until $K_T$ reaches a value that configures the resistive element 314 to have the default resistance of $R_{Y\_DEF}$. Then, the values of control signals CTR_Rf and CTR_Rg that result in the desired value of $R_{Y\_DEF}$ are stored as calibration data in memory element 507. For some embodiments, the calibrated values of $R_f$ and $R_g$, are also stored in memory element 507.

Then, during a normal operational mode of the control circuit 500, memory element 507 provides the control signals CTR_Rg and CTR_Rf to corresponding calibration resistors 504 and 505, which in response thereto reach their respective calibrated resistance values $R_g$ and $R_f$, respectively. Then, as the operating temperature of control circuit 500 changes, $V_x$ will vary with temperature according to equation (13). The resulting varying output voltage $V_x$ may be periodically sampled by the conversion stage 530 and converted into the corresponding digital control signal $K_T$, which as described above maintains the transfer function of integrator circuit 300 relatively constant over temperature variations by adjusting the resistance of resistive element 314 as the operating temperature changes. More specifically, the control signal $K_T$ is used to control operation of switches 402(1)-402(N) of FIG. 4A and switches 404(1)-404(N) of FIG. 4B to adjust the resistances of resistive elements 410 and 420, respectively, to maintain a constant integrator transfer function for circuits such as integrator circuit 300.

For some embodiments, the control circuit 500 includes or is associated with a temperature sensitivity value that indicates the minimum change in temperature that results in a corresponding change in value of the control signal $K_T$. Accordingly, for such embodiments, the control circuit 500 is configured to modify the value of the $K_T$ when temperature variations exceed the temperature sensitivity value. When deployed in high-precision integrator circuits that favor precise temperature compensation adjustments, the control circuit 500 can be configured to have a relatively small temperature sensitivity value. For example, when deployed in audio applications such as noise-cancelling audio headphones, the temperature sensitivity value is typically 0.04% per °C.

The temperature sensitivity depends on the change of $V_x$ with respect to temperature ($\partial V_x/\partial T$), and a voltage resolution of the conversion stage 530. The voltage resolution is a minimum change in $V_x$ that generates a corresponding change in the output control signal $K_T$. Thus, because $V_x$ varies linearly to $R_f$ with respect to temperature (see equation (14)), the temperature sensitivity depends on the material of the second calibration resistor 505 (which determines the variance of $R_f$ with respect to temperature) in addition to the voltage resolution of the conversion stage 530.

Figure 6A:
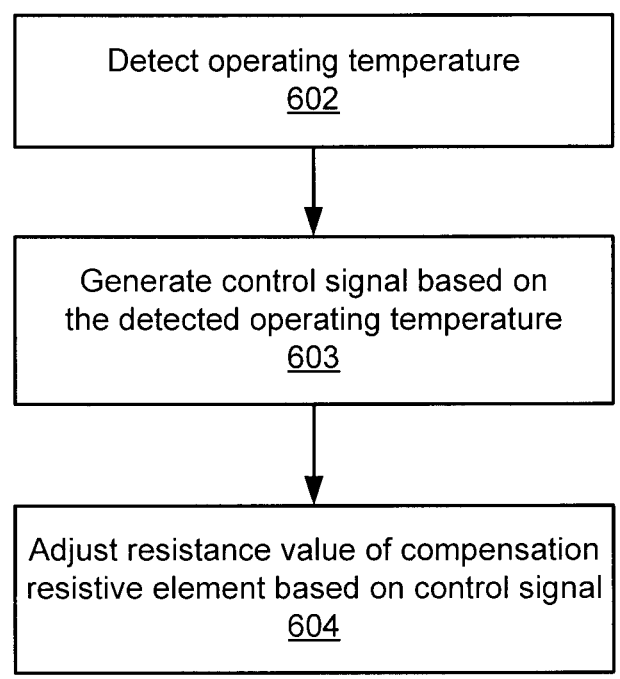
FIG. 6A is an exemplary flowchart depicting an illustrative temperature compensation operation in accordance with present embodiments.

FIG. 6A shows an illustrative flow chart 601 depicting an exemplary temperature compensation operation that may be performed during operation of filter circuit 210 of FIG. 2A or integrator circuits 230(1)-230(M) of FIG. 2B in accordance with the present embodiments. At step 602, a temperature value is detected. For some embodiments, the temperature is detected by measuring the temperature-dependent voltage signal $V_x$ generated by temperature detection stage 520 of FIG. 5. For one embodiment, the temperature-dependent voltage signal is measured using op-amp 503 as described above with respect to FIG. 5.

At step 603, the temperature compensation control signal $K_T$ is generated in response to the temperature-dependent voltage signal $V_x$. For some embodiments, the control signal $K_T$ is generated by converting the temperature-dependent voltage signal $V_x$ into a corresponding digital control signal, for example, using an ADC provided within the conversion stage 530 of control circuit 500. For such embodiments, the ADC is configured to vary the digital signal by a corresponding amount when the temperature-dependent voltage changes by more than a voltage threshold value representative of the voltage resolution of the ADC.

At step 604, the control signal $K_T$ is provided to compensation resistive elements (e.g., calibration resistors 504 and 505 of control circuit 500) to adjust their resistance values in a manner that maintains the integrator transfer function at a relatively constant level over variations in operating temperature.

Figure 6B:
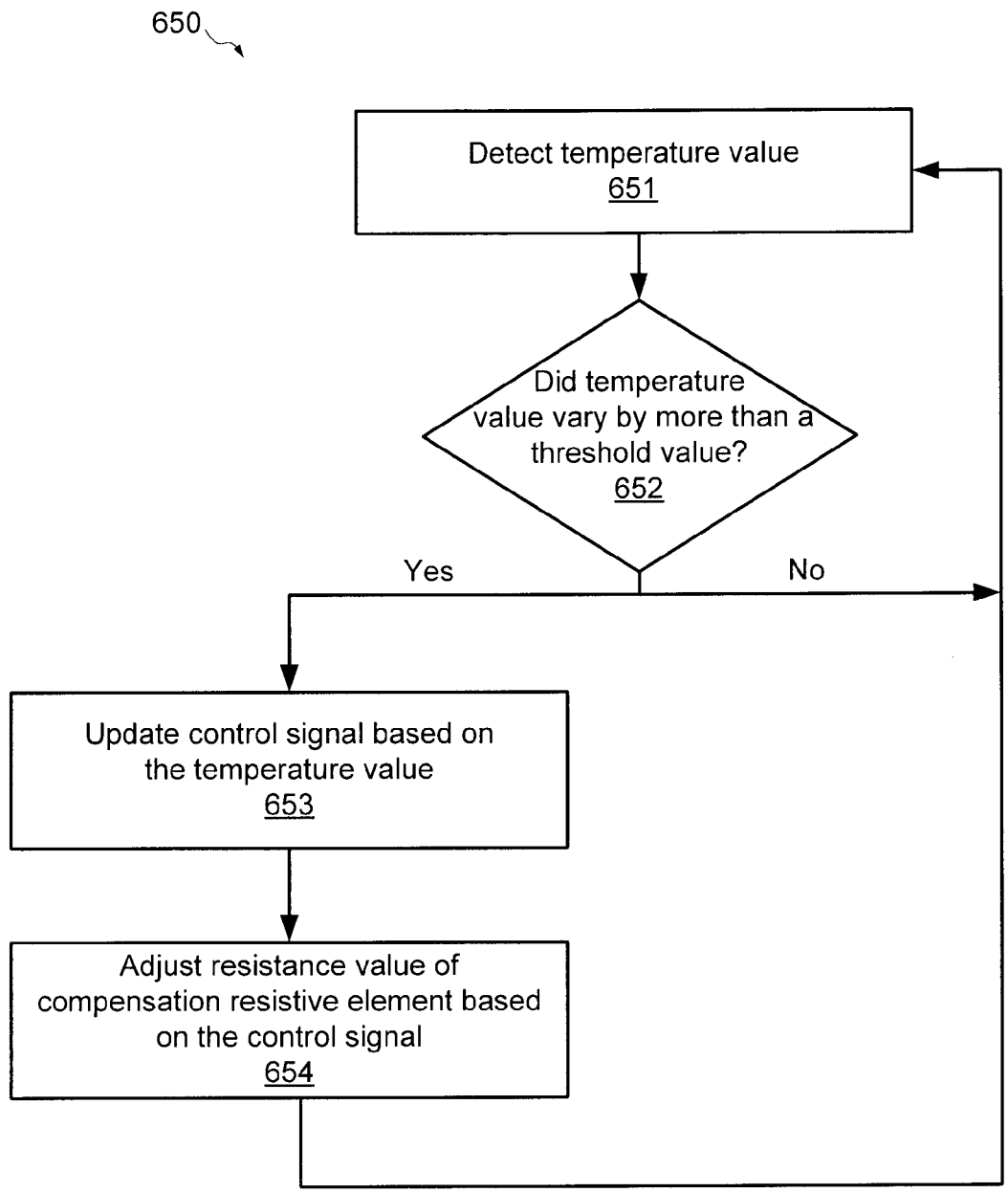
FIG. 6B is an exemplary flowchart depicting another illustrative temperature compensation operation in accordance with present embodiments.

FIG. 6B shows an illustrative flow chart 650 depicting another exemplary temperature compensation operation that may be performed during operation of filter circuit 210 of FIG. 2A or integrator circuits 230(1)-230(M) of FIG. 2B in accordance with the present embodiments. The temperature compensation operation detects temperature variations, updates a control signal that is indicative of the temperature variations, and adjusts a designated resistive element in response to the control signal. The temperature compensation process is repeated continuously during the operation of the filter circuit 210 or integrator circuits 230(1)-230(M).

At step 651 of the temperature compensation operation, a temperature value is detected.

At step 652, a determination is made as to whether the detected temperature value exceeded a previously detected temperature value by more than a specified threshold value. For one or more embodiments, the previously detected temperature value is a temperature value that corresponds to the previous time the control signal $K_T$ was updated. For some embodiments, the specified threshold value is a voltage threshold of an ADC. If the threshold value was not exceeded, the temperature compensation process performs step 651 again.

If the threshold value is exceeded, the control signal $K_T$ is updated based on the detected temperature value at step 653. For certain embodiments, the control signal $K_T$ is updated by an ADC that receives a voltage input indicative of the temperature value.

At step 654, a resistance value of a compensation resistive element is adjusted in response to the updated control signal to compensate for temperature variations of various circuit elements within the filter circuit 210 or integrator circuits 230(1)-230(M). After step 654 is performed, the temperature compensation process repeats step 651.

Figure 7:
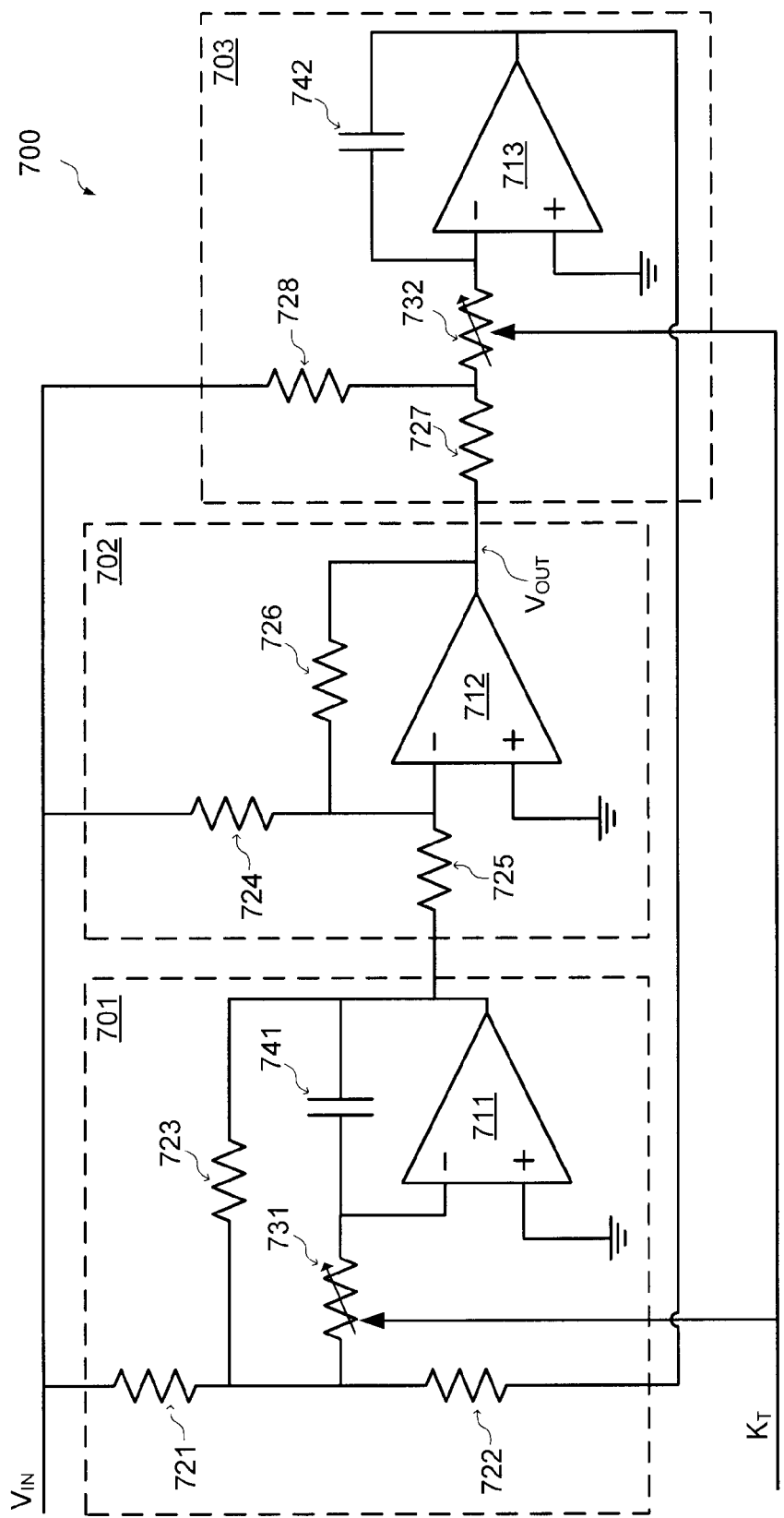
FIG. 7 is a block diagram of a temperature compensated filter circuit in accordance with other embodiments.

FIG. 7 is a detailed circuit diagram of a temperature compensated filter circuit 700 that is one embodiment of the filter circuit 210 of FIG. 2A. The filter circuit 700 has an input to receive an input voltage signal $V_{IN}$, a control input to receive the control signal $K_T$, and an output to transmit a signal $V_{OUT}$. The filter circuit 700 eliminates unwanted frequency components of the input signal $V_{IN}$ to generate $V_{OUT}$. For one embodiment, the filter circuit 700 is a low-pass filter. Other embodiments of the filter circuit 700 can be band-pass or high-pass filters. The filter circuit 700 receives the control signal $K_T$ and is configurable to perform temperature compensation functions in response to $K_T$ to compensate for temperature variations that circuit elements of the filter circuit 700 experience under different operating conditions. Without temperature compensation functions, the transfer function of the filter circuit 700 and other similar circuits would vary as the operating temperatures of the filter circuit 700 varies. As a result, the transfer function of the filter circuit 700 is maintained even as its operating temperature changes.

The filter circuit 700 includes a first voltage integrator stage 701, a voltage summing stage 702, and a second voltage integrator stage 703. Both the first integrator stage 701 and the second integrator stage 703 receive the control signal $K_T$ to adjust their respective outputs in response to $K_T$ to maintain their transfer functions constant under various operating temperatures. Integrator stages 701 and 703 may be implemented as the voltage integrator circuit 300 of FIG. 3A.

The first voltage integrating stage 701 includes an op-amp 711, resistive elements 721-723, a first designated compensation resistive element 731 that is configurable to adjust its resistance value based on the control signal $K_T$, and a capacitive element 741. One terminal of the resistive element 721 is coupled to receive the input voltage signal $V_{IN}$. Another terminal of the resistive element 721 is coupled to resistive elements 722 and 723 as well as to the compensation resistive element 731, as shown in FIG. 7. Resistive element 722 is also coupled to the output of an op-amp 713 of the second integrator stage 703 while resistive element 723 is further coupled to the output of op-amp 711. Compensation resistive element 731 is also coupled to the inverting input of op-amp 711. Capacitive element 741 couples the inverting input of the op-amp 711 to the output of the op-amp 711. The non-inverting input of op-amp 711 is coupled to ground potential.

The voltage summing stage 702 includes an op-amp 712, and resistive elements 724-726. The output of op-amp 712 generates the output signal of the filter circuit 700. The resistive element 725 couples the output of op-amp 711 to the inverting input of op-amp 712. The resistive element 724 is coupled between the input voltage $V_{IN}$ and the inverting input of the op-amp 712. The resistive element 726 couples the output of op-amp 712 to the inverting input of op-amp 712. The non-inverting input of op-amp 712 is coupled to ground potential.

The second voltage integration stage 703 includes an op-amp 713, resistive elements 727 and 728, a second designated compensation resistive element 732 that is configurable to adjust its resistance value based on the control signal $K_t$, and a capacitive element 742. The resistive element 727 is coupled between the output of op-amp 712 and compensation resistive element 732. The resistive element 728 is coupled between input voltage $V_{IN}$ and the common node of resistive element 727 and compensation resistive element 732. The compensation resistive element 732 is coupled between the common node of resistive elements 727 and 728 and the inverting input of the op-amp 713. The capacitive element 742 couples the output of op-amp 713 to the inverting input of op-amp 713. The non-inverting input of the op-amp 713 is coupled to ground potential. As previously mentioned, the output of op-amp 713 is also coupled to resistive element 722.

Compensation resistive elements 731 and 732 each receive the temperature compensation control signal $K_T$, and in response thereto adjust their respective resistive values For one embodiment, the control signal $K_T$ is a digital signal and the compensation resistive elements 731 and 732 are similar to the compensation resistive elements illustrated in FIGS. 4A and 4B.

Figure 8A:
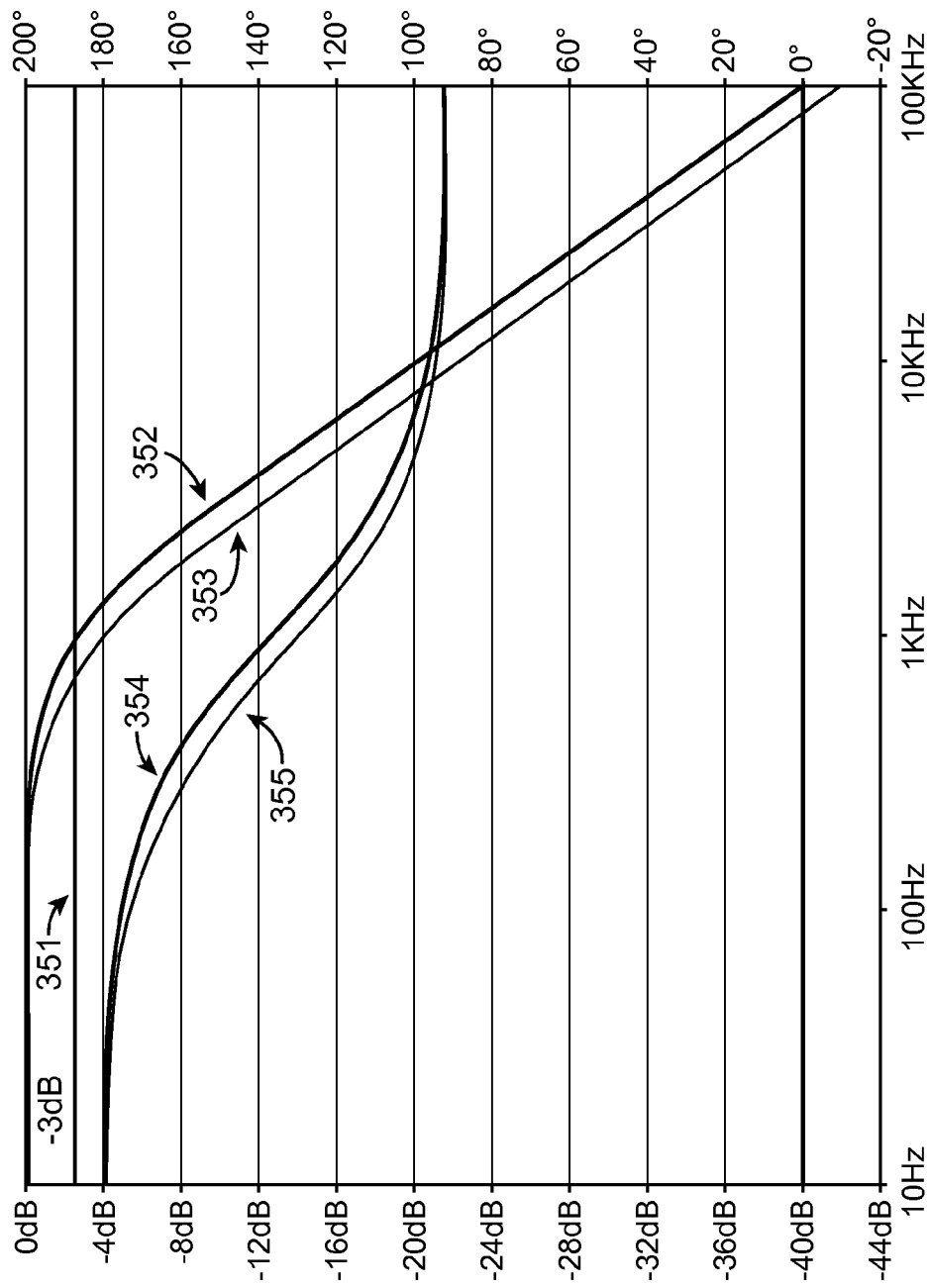
FIG. 8A illustrates two frequency response graphs of an exemplary embodiment of the integrator circuit of FIG. 3B.

FIG. 8A illustrates two frequency response graphs of an exemplary embodiment of the lossy integrator circuit 301 of FIG. 3B. Each frequency response graph includes a magnitude plot indicating the magnitude of a transfer function as a function of a frequency of an input signal and a phase plot indicating the phase of a transfer function as a function of the frequency the input signal. A first frequency response graph, including magnitude plot 353 and phase plot 355, represents a first transfer function of the exemplary embodiment under an operating temperature of –20° C. (a temperature variation of –40° C. from the default temperature) with the temperature compensation process turned off. Referring to FIG. 2A, the temperature compensation process may be turned off by disabling the control circuit 220 which generates the temperature compensation control signal $K_T$. A second frequency response graph, including magnitude plot 352 and phase plot 354, illustrates a second transfer function of the exemplary embodiment under the operating temperature of –20° C. with the temperature compensation process operational. For one or more embodiments of the lossy integrator circuit 301, the temperature compensation process being operational means that a temperature compensation control circuit (e.g. control circuit 500 of FIG. 5) detects a temperature value and generates a corresponding control signal that is received and used by the lossy integrator circuit 301 to adjust a single resistive element (e.g. compensation resistive element 333 of lossy integrator circuit 301).

The exemplary embodiment is configured to achieve a cutoff (–3 dB) frequency of 1 kHz under a default temperature of 20° C. Line 351 illustrates a –3 dB cutoff threshold for magnitude plots. When operating under the default temperature, a magnitude plot of a frequency response of the exemplary embodiment crosses line 351 at a frequency of 1 kHz.

Magnitude plot 353 illustrates magnitude of the first frequency response as a function of an input signal frequency. The magnitude plot 353 crosses the –3 dB threshold at 0.8 kHz, resulting in a cutoff frequency with deviation of 200 Hz (or 20%) from the cutoff frequency achieved by the embodiment under the default temperature. This deviation of circuit behavior of 20% is due to the temperature deviation of –40° C. from the default temperature.

Magnitude plot 352 illustrates a magnitude of the second frequency response as a function of the input signal frequency. The magnitude plot 352 crosses the –3 dB threshold at 1.03 kHz, resulting in a cutoff frequency that deviates 30 Hz (or 3%) from the cutoff frequency achieved by the embodiment under the default temperature. As a result, the temperature compensation process being operational results in a temperature variation of circuit a circuit characteristic that is significantly more tolerable than when the temperature compensation is not performed.

In many applications of the integrator circuit 301, a deviation of 3% due to temperature variations is acceptable and does not lead to performance degradation or instability of a system that includes the integrator circuit 301. On the other hand, a deviation of 20% is often not acceptable and would either cause unacceptable performance or system instability. Thus, the temperature compensation process operates to enable embodiments of integrator circuit 301 as well as systems that include such embodiments to operate in a wider range of operating temperatures while achieving expected output characteristics.

Phase plot 355 illustrates phase of the first transfer function as a function of the input signal frequency. The phase plot 355 is shifted left (downward in frequency) compared to the exemplary embodiment's phase response under the default temperature. Phase plot 354 illustrates a phase of the transfer function of the second transfer function as a function of the input signal frequency. The temperature compensation process shifts the phase response 354 of the exemplary embodiment towards the expected phase response.

Figure 8B:
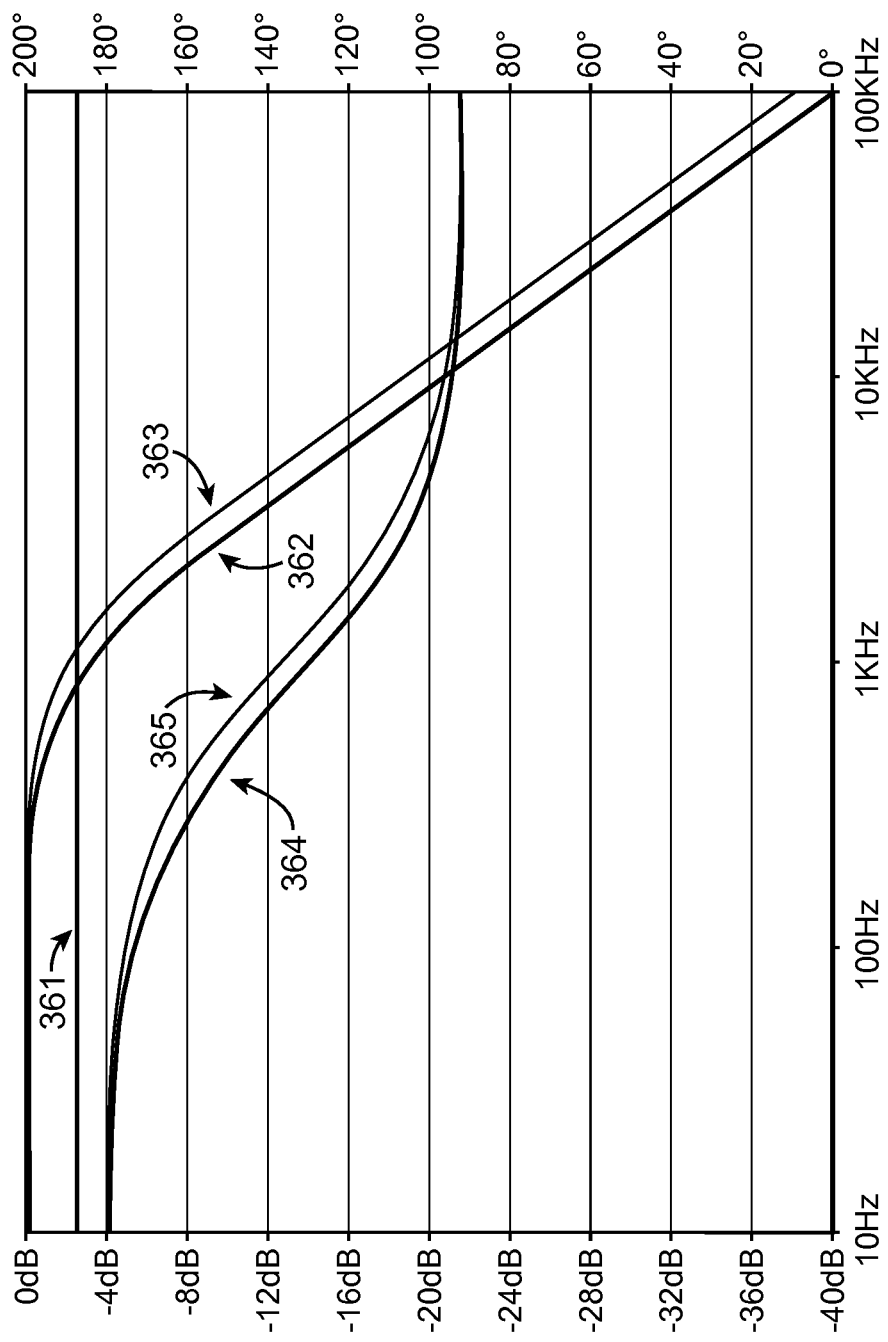
FIG. 8B illustrates another two frequency response graphs of an exemplary embodiment of the integrator circuit of FIG. 3B.

FIG. 8B illustrates another two frequency response graphs of an exemplary embodiment of the lossy integrator circuit 301. Each frequency response graph includes a magnitude plot indicating the magnitude of a transfer function as a function of frequency and a phase plot indicating the phase of a transfer function as a function of frequency. A first frequency response graph, including magnitude plot 363 and phase plot 365, represents a first transfer function of the exemplary embodiment under an operating temperature of 60° C. (a temperature variation of +40° C. from the default temperature) with the temperature compensation process turned off. A second frequency response graph, including magnitude plot 362 and phase plot 364, represents a second transfer function of the exemplary embodiment under the operating temperature of 60° C. with the temperature compensation process operational.

The exemplary embodiment is the same as the one discussed with respect to FIG. 8A. Line 361 illustrates a –3 dB threshold for magnitude plots. When operating under the default temperature, a magnitude plot of a frequency response of the exemplary embodiment crosses line 351 at a frequency of 1 kHz.

Magnitude plot 363 illustrates the magnitude first frequency response as a function of an input signal frequency. The magnitude plot 353 crosses the –3 dB threshold at 1.25 kHz, resulting in a cutoff frequency with deviation of 250 Hz (or 25%) from the cutoff frequency achieved by the embodiment under the default temperature.

Magnitude plot 362 illustrates the magnitude of the second frequency response as a function of the input signal frequency. The magnitude plot 362 crosses the –3 dB threshold at 1.02 kHz, resulting in a cutoff frequency that deviates 20 Hz (or 2%) from the cutoff frequency achieved by the embodiment under the default temperature.

Phase plot 365 illustrates phase of the first transfer function as a function of the input signal frequency. The phase plot 365 is shifted right (upward in frequency) compared to the exemplary embodiment's phase response under the default temperature. Phase plot 364 illustrates a phase of the transfer function of the second transfer function as a function of the input signal frequency. The temperature compensation process shifts the phase response of the exemplary embodiment towards the expected phase response.

Figure 8C:
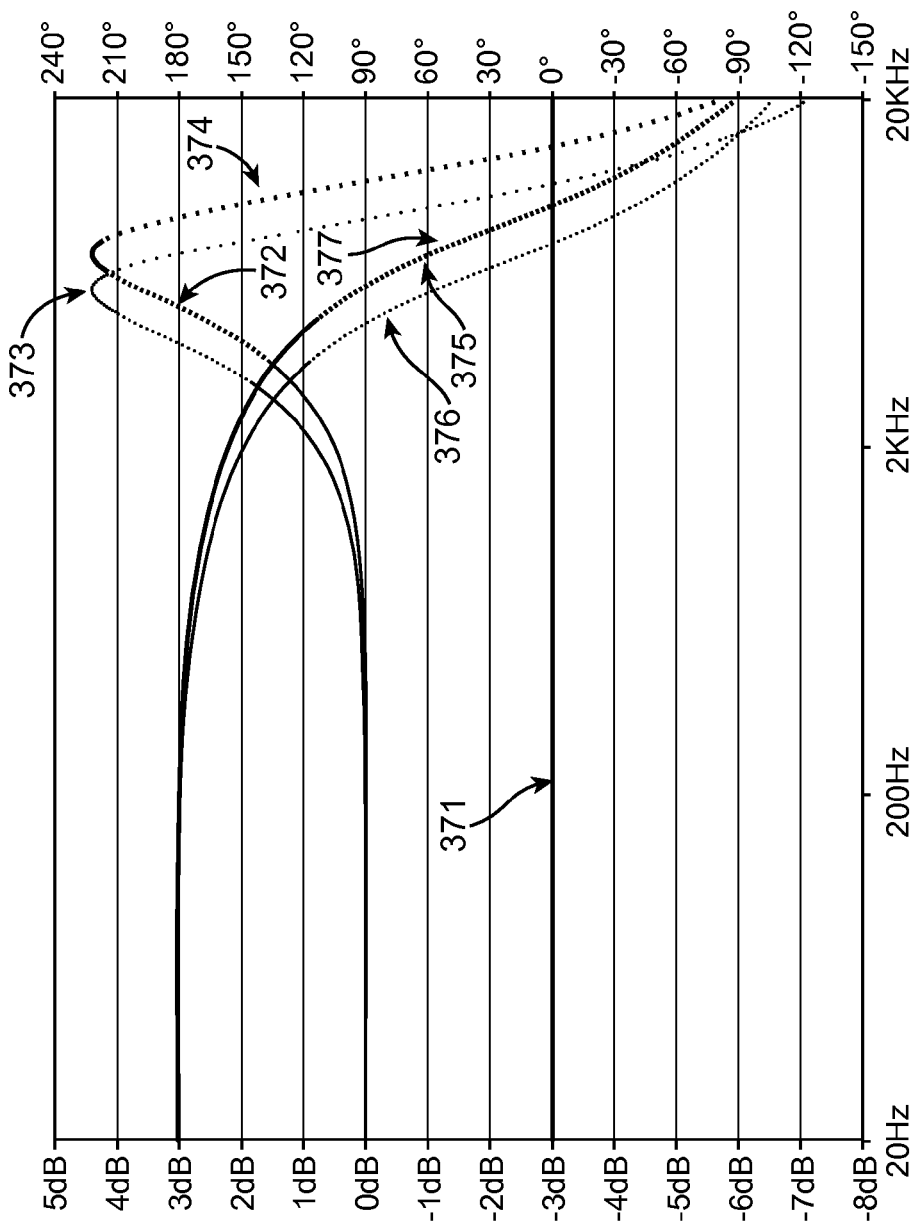
FIG. 8C illustrates three frequency response graphs of an exemplary embodiment of the filter circuit of FIG. 7.

FIG. 8C includes three frequency response graphs of an exemplary embodiment of the filter 700 of FIG. 7. Each frequency response graph includes a magnitude plot indicating the magnitude of a transfer function as a function of frequency and a phase plot indicating the phase of a transfer function as a function of frequency. A first frequency response graph, including magnitude plot 372 and phase plot 375, illustrates a first transfer function of the exemplary embodiment under a default temperature of 20° C. A second frequency response graph, including magnitude plot 373 and phase plot 376, illustrates a second transfer function of the exemplary embodiment under an operating temperature of –20° C. (a temperature variation of –40° C. from the default temperature) with the temperature compensation process turned off. A third frequency response graph, including magnitude plot 374 and phase plot 377, illustrates a third transfer function of the exemplary embodiment under the same operating temperature of –20° C. with the temperature compensation process operational.

The exemplary embodiment is configured to have a –3 dB frequency of 14.75 kHz. Line 371 illustrates a –3 dB threshold for magnitude plots of transfer functions. Accordingly, magnitude plot 372 of the first transfer function crosses line 371 at a frequency of 14.75 kHz.

Magnitude plot 373 illustrates magnitude of the second transfer function as a function of an input signal frequency. Referring to FIG. 2A, the temperature compensation process may be turned off by disabling the control circuit 220 which generates the temperature compensation control signal $K_T$. The magnitude plot 373 crosses the –3 dB threshold at a frequency of 11.78 kHz, resulting in a –3 dB frequency (11.78 kHz) having a deviation of 2.97 kHz (or 20.1%) from the –3 dB frequency achieved by the exemplary embodiment under the default temperature (14.75 kHz).

Magnitude plot 374 illustrates magnitude of the third transfer function as a function of the input signal frequency. For one or more embodiments of the filter circuit 700, the temperature compensation process being operational means that a temperature compensation control circuit (e.g. control circuit 500 of FIG. 5) detects a temperature value and generates a corresponding control signal (e.g. $K_T$) that is received and used by the filter circuit 700 to adjust a single resistive element (e.g. compensation resistive element 333 of FIG. 3B). The magnitude plot 374 crosses the –3 dB threshold at 15.19 kHz, resulting in a –3 dB frequency (15.19 kHz) that deviates 440 Hz (or 3%) from the –3 dB frequency achieved by the exemplary embodiment under the default temperature (14.75 kHz).

Phase plot 375 illustrates phase of the first transfer function as a function of the input signal frequency. Phase plot 376 illustrates a phase of the second transfer function as a function of the input signal frequency. In comparison to the phase plot 375 of first transfer function, the phase plot 376 of the second transfer function is shifted to the left (or downward in frequency). Phase plot 377 illustrates a phase of the third transfer function as a function of the input signal frequency. Phase plot 377 is achieved under the same temperature variation of –40° C. from the default temperature as the temperature resulting in plot 376. In comparison to phase plot 376, phase plot 377 is corrected by the temperature compensation process to be close to phase plot 375 (phase response of the embodiment under the default temperature). Although present embodiments have been described with reference to specific exemplary embodiments thereof, it will be evident that various modifications and changes may be made thereto without departing from the broader spirit and scope of the disclosure as set forth in the appended claims. The specification and drawings are, accordingly, to be regarded in an illustrative rather than a restrictive sense.

What is claimed is:

1. A system for minimizing variations in a transfer function of a voltage integration circuit due to temperature variations, the voltage integration circuit comprising:
   a resistive stage having a plurality of input voltage terminals and an output terminal, comprising:
      a plurality of input resistors each coupled between an intermediate node of the resistive stage and a corresponding one of the plurality of input voltage terminals; and
      a single compensation resistive element coupled between the intermediate node and the output terminal and having a control terminal to receive a temperature compensation control signal indicative of the temperature variations, wherein an impedance of the single compensation resistive element is selectively adjusted in response to the temperature compensation control signal; and
   an amplification stage comprising a first operational amplifier having a first input coupled to ground potential, a second input coupled to the output terminal of the resistive stage, and an output coupled to the second input by a feedback capacitor.

2. The system of claim 1, wherein the impedance of the single compensation resistive element is adjusted by the temperature compensation control signal to compensate for variations in resistance values of the plurality of input resistors resulting from the temperature variations.

3. The system of claim 1, wherein the voltage integration circuit has a time constant ($\tau$) expressed as $\tau=1/(RC)$, wherein R is a resistance value equal to a parallel combination of resistance values of the input resistors ($R_{IN}$) plus the impedance of the single compensation resistive element ($R_Y$), and C is a capacitance value of the feedback capacitor.

4. The system of claim 3, wherein the single compensation resistive element has default impedance value $R_{Y\_DEF}=\eta R_{IN}$ at a default operating temperature, where $\eta$ is scaling factor.

5. The system of claim 1, wherein the single compensation resistive element comprises:
   a plurality of compensation resistors coupled in series between the intermediate node and the output terminal of the resistive stage; and
   a plurality of switches, each coupled in parallel with a corresponding one of the compensation resistors and having a control terminal to a receive a corresponding bit of the temperature compensation control signal.

6. The system of claim 5, wherein each switch selectively shunts its corresponding compensation resistor if the corresponding bit of the temperature compensation control signal is asserted.

7. The system of claim 1, wherein the single compensation resistive element comprises:
   a plurality of pairs of compensation resistors and switches, each pair coupled in parallel between the intermediate node and the output terminal of the resistive stage, wherein each switch includes a control terminal to a receive a corresponding bit of the temperature compensation control signal.

8. The system of claim 7, wherein each switch selectively couples its corresponding compensation resistor to the intermediate node in response to the corresponding bit of the temperature compensation control signal.

9. The system of claim 1, further comprising a control circuit for generating the temperature compensation control signal, wherein the temperature compensation control signal is indicative of an operating temperature of the system.

10. The system of claim 9, wherein the control circuit comprises:
    a first calibration resistor having a control terminal to receive a first calibration control signal;
    a second calibration resistor having a control terminal to receive a second calibration control signal;
    a second operational amplifier having a first input to receive a reference voltage, a second input coupled to ground potential through the first calibration resistor, and an output coupled to the second input through the second calibration resistor, wherein the output of the second operational amplifier generates a control voltage indicative of the operating temperature; and
    a memory element coupled to the first and second calibration resistors and configured to store the first and second calibration control signals.

11. The system of claim 10, wherein the first and second calibration control signals are individually adjusted to independently alter resistance values of the first and second calibration resistors, respectively.

12. The system of claim 10, further comprising:
    a conversion stage having an input to receive the control voltage, and having an output configured to generate the temperature compensation control signal in response to the control voltage.

13. The system of claim 10, wherein during a calibration mode, the first and second calibration control signals are adjusted to alter the resistance values of the first and second calibration resistors, respectively, until the transfer function of the voltage integration circuit reaches a predetermined temperature characteristic, and then the resulting values of the first and second calibration control signals are stored in the memory element.

14. A method for minimizing temperature-dependent variations in the transfer function of a voltage integration circuit, wherein the voltage integration circuit includes a single compensation resistive element coupled between a first operational amplifier and a plurality of parallel-connected input resistors configured to receive a plurality of input voltages, the method comprising:
    selectively adjusting a number of calibration control signals provided to control terminals of corresponding calibration resistors of a control circuit to adjust an output value of a temperature compensation control signal generated by the control circuit, wherein the temperature compensation control signal is indicative of an operating temperature of the circuit;
    selectively adjusting a resistance value of the single compensation resistive element in response to the temperature compensation control signal until the transfer function achieves a predetermined temperature characteristic; and
    storing values for the calibration signals that result in the transfer function achieving the predetermined temperature characteristic in a memory element provided within the control circuit.

15. The method of claim 14, further comprising:
    providing the values of the calibration control signals stored in the memory element to the corresponding calibration resistors;
    generating the temperature compensation control signal using the control circuit; and
    selectively adjusting the resistance value of the single compensation resistive element in response to the temperature compensation control signal, wherein the temperature compensation control signal is indicative of variations in the operating temperature of the circuit.

* * * * *